US009947659B2

(12) United States Patent
Wang et al.

(10) Patent No.: US 9,947,659 B2
(45) Date of Patent: Apr. 17, 2018

(54) FIN FIELD-EFFECT TRANSISTOR GATED DIODE

(71) Applicant: MediaTek Inc., Hsin-Chu (TW)

(72) Inventors: Chang-Tzu Wang, Yangmei (TW); Bo-Shih Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 52 days.

(21) Appl. No.: 15/122,379

(22) PCT Filed: May 25, 2015

(86) PCT No.: PCT/CN2015/079658
§ 371 (c)(1),
(2) Date: Aug. 29, 2016

(87) PCT Pub. No.: WO2015/180595
PCT Pub. Date: Dec. 3, 2015

(65) Prior Publication Data
US 2016/0372468 A1    Dec. 22, 2016

Related U.S. Application Data

(60) Provisional application No. 62/003,265, filed on May 27, 2014.

(51) Int. Cl.
*H01L 27/02* (2006.01)
*H01L 27/088* (2006.01)
(Continued)

(52) U.S. Cl.
CPC ........ *H01L 27/0886* (2013.01); *H01L 23/535* (2013.01); *H01L 27/027* (2013.01); *H01L 29/785* (2013.01)

(58) Field of Classification Search
None
See application file for complete search history.

(56) References Cited

U.S. PATENT DOCUMENTS 6,835,967 B2    12/2004    Yeo et al.
7,943,961 B2 *    5/2011    Wang ................ H01L 21/76802
                                                            257/178
(Continued)

FOREIGN PATENT DOCUMENTS

| CN | 1532948 | 9/2004 |
| CN | 103199012 | 7/2013 |

OTHER PUBLICATIONS

International Search Report dated Aug. 14, 2015, issued in application No. PCT/CN2015/079658.

*Primary Examiner* — Michael Lebentritt
(74) *Attorney, Agent, or Firm* — McClure, Qualey & Rodack, LLP (57) ABSTRACT

The invention provides a semiconductor device. The semiconductor device includes a fin field effect transistor (finFET) array including finFET units. Each of the finFET units includes a substrate having a fin along a first direction. A first metal strip pattern and a second metal strip pattern are formed on the fin, extending along a second direction that is different from the first direction. The first and second metal strip patterns are conformally formed on opposite sidewalls and a top surface of the fin, respectively. A first contact and a second contact are formed on the fin. The first and second metal strip patterns are disposed between the first and second contacts. A first dummy contact is formed on the fin, sandwiched between the first and second metal strip patterns.

20 Claims, 7 Drawing Sheets

(51) Int. Cl.
*H01L 29/78* (2006.01)
*H01L 23/535* (2006.01)

(56) References Cited

U.S. PATENT DOCUMENTS

| | | | | |
|---|---|---|---|---|
| 8,035,170 | B2* | 10/2011 | Inaba | H01L 21/84 |
| | | | | 257/401 |
| 8,258,572 | B2* | 9/2012 | Liaw | H01L 27/0207 |
| | | | | 257/327 |
| 8,598,032 | B2* | 12/2013 | Chen | H01L 27/11286 |
| | | | | 257/E23.169 |
| 8,754,486 | B2 | 6/2014 | Lee et al. | |
| 9,318,477 | B2* | 4/2016 | Lee | H01L 27/0207 |
| 9,698,047 | B2* | 7/2017 | Hung | H01L 21/768 |
| 2013/0292745 | A1 | 11/2013 | Liu et al. | |
| 2014/0131831 | A1* | 5/2014 | Wei | H01L 21/77 |
| | | | | 257/506 |
| 2014/0145272 | A1* | 5/2014 | Or-Bach | H01L 27/0688 |
| | | | | 257/369 |
| 2015/0076569 | A1* | 3/2015 | Hong | H01L 29/785 |
| | | | | 257/288 |
| 2015/0123184 | A1* | 5/2015 | Wang | H01L 27/0925 |
| | | | | 257/315 |
| 2017/0062421 | A1* | 3/2017 | Cosemans | H01L 23/535 |
| 2017/0286584 | A1* | 10/2017 | Lefferts | G06F 17/5072 |

\* cited by examiner

FIN FIELD-EFFECT TRANSISTOR GATED DIODE

CROSS REFERENCE TO RELATED APPLICATIONS

This application claims the benefit of U.S. Provisional Application No. 62/003,265 filed May 27, 2014, the entirety of which is incorporated by reference herein.

TECHNICAL FIELD

The present invention relates to a semiconductor device, and in particular to a design for fin field-effect transistor (finFET) gated diode devices.

BACKGROUND

Integrated circuit design requires a shrinkage channel length for an electronic device, and an increased amount of input/output connections (pin account) for multi-functional cells. Accordingly, fin-like electronic devices have been developed to the increase pin accesses for the cells. However, the problems of parasitic capacitance and self-heating become significant in high density fin-like electronic devices.

Thus, a novel fin-like electronic device is needed.

SUMMARY

A semiconductor device is provided. An exemplary embodiment of a semiconductor device includes a fin field effect transistor (finFET) array including finFET units. Each of the finFET units includes a substrate having a fin along a first direction. A first metal strip pattern and a second metal strip pattern are formed on the fin, extending along a second direction that is different from the first direction. The first and second metal strip patterns are conformally formed on opposite sidewalls and a top surface of the fin, respectively. A first contact and a second contact are formed on the fin. The first and second metal strip patterns are disposed between the first and second contacts. A first dummy contact is formed on the fin, sandwiched between the first and second metal strip patterns.

Another exemplary embodiment of a semiconductor device includes a fin field effect transistor (finFET) array including finFET units. Each of the finFET units includes a substrate having a fin along a first direction. A first contact is formed on the fin and is coupled to a first doped region of the first conduction type formed in a first portion of the fin. A second contact is formed on the fin and is coupled to a second doped region formed in a second portion of the fin. The second doped region has a second conduction type that is opposite to the first conduction type. A first gate strip and a second gate strip are formed on the fin, between the first and second contacts and separated from each other by a third contact. The third contact, the first gate strip and the second gate strip are electrically floating.

A fin-like electronic device is provided. An exemplary embodiment of a fin-like electronic device includes a device array composed of field effect transistor (finFET) units with a first pitch. Each of the finFET units includes a substrate having a fin along a first direction. A first contact formed on the fin is coupled to a first doped region of the first conduction type formed in a first portion of the fin. A second contact formed on the fin is coupled to a second doped region formed in a second portion of the fin. The second doped region has a second conduction type that is opposite to the first conduction type. A first gate strip and a second gate strip are formed on the fin, between the first and second contacts and separated from each other by a first dummy contact. The first dummy contact is separated from the first gate strip and the second gate strip by a first distance that is equal to one-fourth of the first pitch.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments provide semiconductor devices. The semiconductor devices include fin field effect transistor (hereinafter, finFET) unit cells arranged as an array. The finFET unit cell serves as a finFET gated diode device, which can be used as electrostatic discharge (ESD) protection device in the finFET technology. The finFET unit cell includes at least one dummy contact inserted between the anode contact and the cathode contact. Also, there are two gate strips disposed in one finFET unit cell. The dummy contact is electrically floating so that the space between the anode and the cathode is increased. Each of the finFET unit cells can be used as a gated diode with a reduced parasitic capacitance, for example, contact-to-gate parasitic capacitance, metal layer-to-gate parasitic capacitance, contact-to-contact parasitic capacitance (anode-to-cathode parasitic capacitance) or metal layer-to-metal layer parasitic capacitance.

In some embodiments, the finFET unit cells are periodically arranged in a specific direction with a pitch. In some embodiments, any two of the adjacent finFET unit cells illustrate the mirror symmetry of the interface therebetween. That is, any two of the adjacent finFET unit cells are mirror images of one another.

Figure 1:
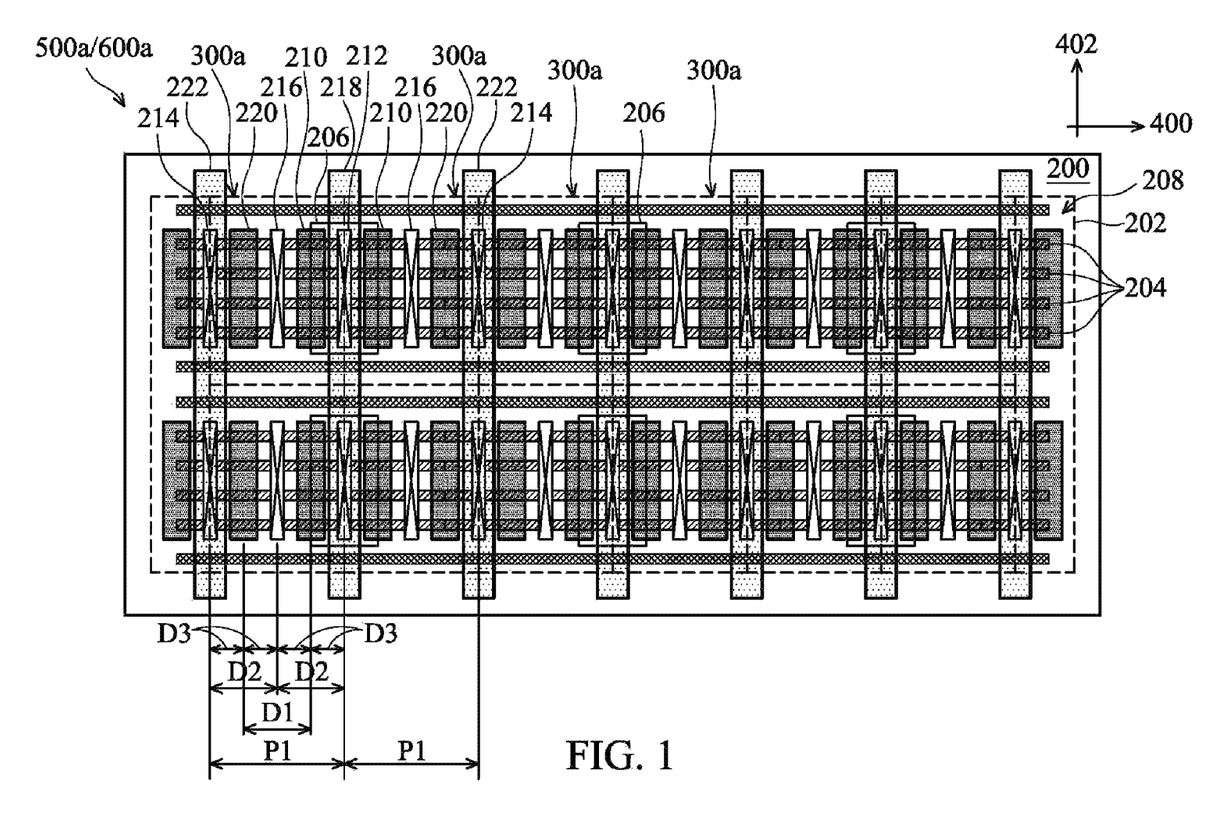
FIG. 1 is a top view of a semiconductor device in accordance with some embodiments of the disclosure.
Figure 3:
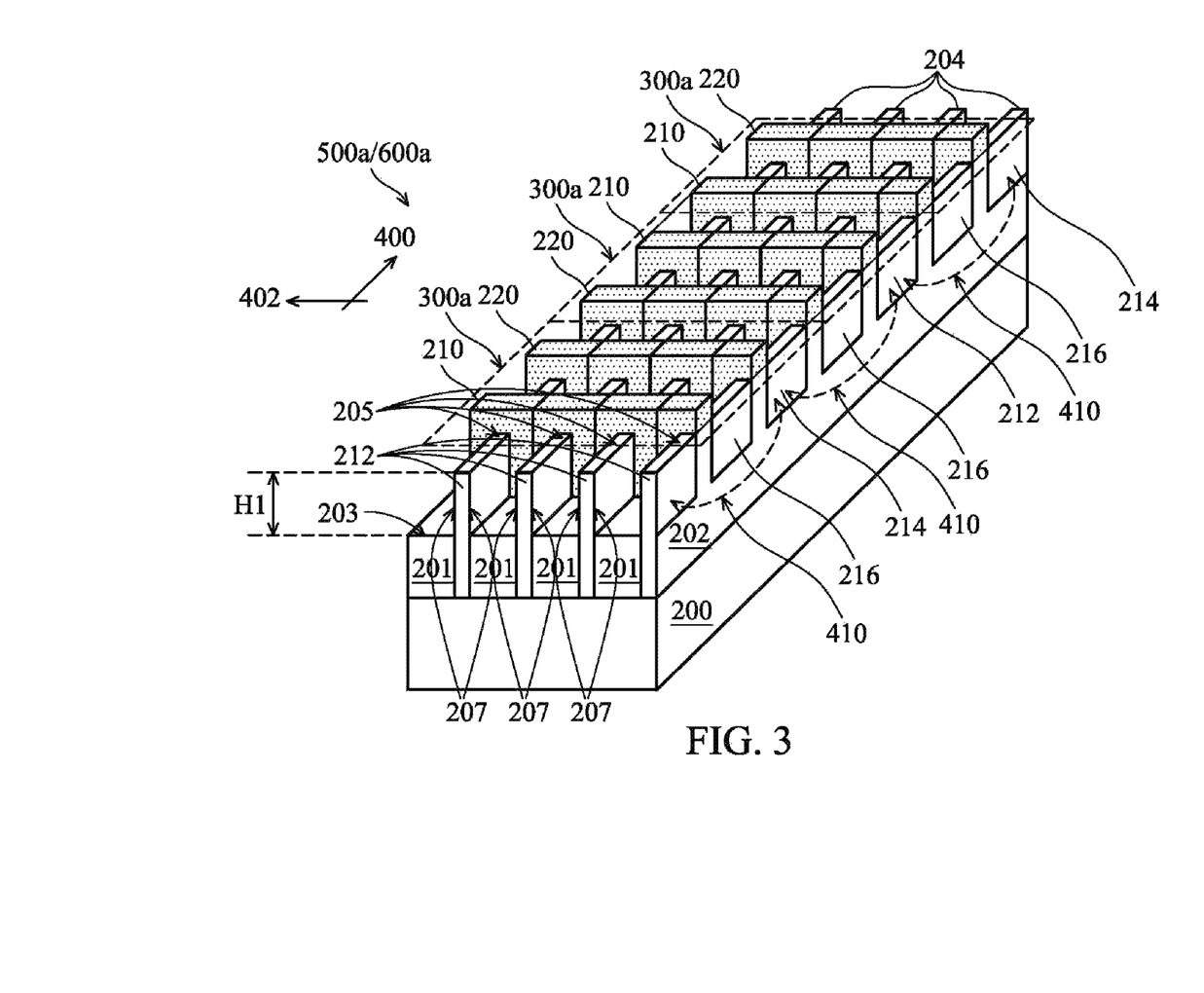
FIG. 3 is a perspective view of a portion of FIG. 1 showing a fin field effect transistor (finFET) array composed of finFET unit cells in accordance with some embodiments of the disclosure.

FIG. 1 is a top view of a semiconductor device 500a/600a in accordance with some embodiments of the disclosure. FIG. 3 is a perspective view of a portion of FIG. 1 showing a fin field effect transistor (finFET) array composed of finFET unit cells 300a in accordance with some embodiments of the disclosure. As shown in FIG. 1 and FIG. 3, the semiconductor device 500a/600a comprises finFET units 300a arranged as an array along a direction 400. Each of the finFET units 300a comprises a substrate 200 having at least one fin 204, metal strip patterns 210 and 220 and contacts 212, 214 and 216. Also, the semiconductor device 500a/600a comprises metal routing patterns 218 and 222 coupled to the contacts 212 and 214, respectively. In some embodiments, the substrate 200 may comprise a semiconductor wafer or a silicon on insulator wafer. The substrate 200 may be doped with dopants having a first conduction type. When the first conduction type is p-type, the substrate 200 is a p-type substrate. Alternatively, when the first conduction type is n-type, the substrate 200 is an n-type substrate.

As shown in FIG. 1 and FIG. 3, the substrate 200 having fins 204 extending along the direction 400. The fins 204 are surrounded by trench isolation features 201 as shown in FIG. 3. In some embodiments, the trench isolation features 201 may comprise shallow trench isolation features. Top surfaces 205 of the fins 204 protrude top surface 203 of the trench isolation features 201 by a height H1.

In some embodiments as shown in FIG. 1 and FIG. 3, the semiconductor device 500a/600a may comprise a well doped region 202 of a second conduction type formed in the substrate 200 by an implantation process. The second conduction type is opposite to the first conduction type. In some embodiments, when the second conduction type is n-type, and the well doped region 202 is an n-type well doped region. Alternatively, when the second conduction type is p-type, and the well doped region 202 is a p-type well doped region. Also, the finFET units 300a of the finFET array are disposed within the well doped region 202.

As shown in FIG. 1 and FIG. 3, the finFET unit 300a comprises at least two metal strip patterns 210 and 220 formed on the fins 204. The metal strip patterns 210 and 220 are formed extending along a direction 402. It should be noted that the direction 402 is not parallel to the direction 400. For example, the direction 402 is substantially perpendicular to the direction 400. The metal strip patterns 210 and 220 are conformally formed on opposite sidewalls 207 and the top surfaces 205 of the fins 204, respectively. In some embodiments, the metal strip patterns 210 and 220 serve as gate electrodes of the finFET unit cells 300a by the gate-replacement process. The metal strip patterns 210 and 220 also serve as gate strips of the finFET units 300a. In some embodiments, the metal strip patterns 210 and 220 are electrically floating or coupled to a circuit (not shown).

As shown in FIG. 1, the finFET unit 300a comprises doped regions 206 and 208 formed in the substrate 200 by an implantation process. Also, the doped regions 206 and 208 are formed within the well doped region 202. The doped region 206 has the first conduction type, and the doped region 208 has the second conduction type that is opposite to the first conduction type. In some embodiments, when the doped region 206 is a p-type doped region, the doped region 208 is an n-type doped region. Alternatively, when the doped region 206 is an n-type doped region, the doped region 208 is a p-type doped region. Also, the doped regions 206 and 208 are heavily doped region, and the dopant concentration of the doped regions 206 and 208 is between about $10^{-16}$ atom/cm$^3$ and about $10^{-18}$ atom/cm$^3$. The doped region 206 is formed in a first portion of each of the fins 204. It should be noted that the first portion of the fin 204 is a region overlapping the doped region 206. The doped region 208 adjacent to the doped region 206 is formed in a second portion of each of the fins 204. In this embodiment, the second portion of the fin 204 is a region excepting the first portion of the fin 204. The doped regions 206 and 208 may serve as pick-up doped region for anode and cathode electrodes of the finFET unit cells 300a.

In some embodiments as shown in FIG. 1, the metal strip pattern 210 overlaps both the doped regions 206 and 208, and the metal strip pattern 220 overlaps the doped region 208 only as shown in FIG. 1.

As shown in FIG. 1 and FIG. 3, the contact 212 and the contact 214 are formed on the fin 202. The contact 212 and the contact 214 are respectively coupled to the doped regions 206 and 208. In some embodiments, the contacts 212 and 214 serve as anode and cathode electrodes of the finFET unit cells 300a, respectively. The metal strip patterns 210 and 220 are disposed between the contacts 212 and 214. As shown in FIG. 1, a distance between the contacts 212 and 214 and along the direction 400 is equal to a pitch P1 of the finFET units 300a.

In some embodiments, a region of the fin 204, which overlaps the metal strip pattern 210 or 220 and between the contacts 212 and 214, is defined as a channel region of a finFET. The channel region has a channel length along the direction 400 in a top view as show in FIG. 1. The channel length is designed to be equal to or less than 20 nm, for example, 20 nm, 16 nm, 14 nm or 10 nm.

As shown in FIG. 1 and FIG. 3, the finFET unit 300a further comprises the contact 216 on the fins 204. In some embodiments, the contact 216 is formed sandwiched between the metal strip patterns 210 and 220 along the direction 400. Therefore, the metal strip patterns 210 and 220 are separated from each other by the contact 216 along the direction 400 to follow the finFET design rule. In some embodiments, a distance D1, which is between the metal strip patterns 210 and 220, along the direction 400 can be equal to a half-pitch of the finFET units 300a (i.e. D1=½P1, wherein P1 is a pitch of the finFET units 300a). It should be noted that the relationship between the distance D1 and the pitch P1 of the finFET units 300a is merely an embodiment. The distance D1 can be designed to be greater than a specific value and not limited to the disclosed embodiment. Also, the contact 216 is separated from the contacts 212 and 214 through the metal strip patterns 210 and 220 along the direction 400, respectively. In some embodiments, the distance D2, which is between the contact 216 and the contact 212 or 214, can be equal to a half-pitch of the finFET unit 300a (i.e. D2=½P1, wherein P1 is a pitch of the finFET units 300a). It should be noted that the relationship between the distance D2 and the pitch P1 of the finFET units 300a is merely an embodiment. The distance D2 can be designed to be greater than a specific value and not limited to the disclosed embodiment. In some embodiments, the contact 216 serves as a dummy contact of the finFET unit 300a. That is, the contact 216 is electrically floating. The contact 216 is coupled to the doped region 208. Furthermore, the metal strip pattern 210 may be separated from the contacts 212 and 216 by a distance D3. The metal strip pattern 220 may be separated from the contacts 214 and 216 by the same distance D3, respectively, In some embodiments, the distance D3 can be equal to one-fourth of the pitch of the finFET units 300a (i.e. D3=¼P1 wherein P1 is a pitch of the finFET units 300a). It should be noted that the relationship between the distance D3 and the pitch P1 of the finFET units 300a is merely an embodiment. The distance D3 can be designed to be greater than a specific value and not limited to the disclosed embodiment.

In the semiconductor device 500a as shown in FIG. 1, the substrate 200 is a p-type substrate 200, the well doped region 202 is an n-type well doped region. Also, the doped region 206 is a p+ doped region and the doped region 208 is an n+ doped region. Accordingly, the finFET unit 300a of the semiconductor device 500a may serve as a finFET gated diode with the contact 212 serving as an anode and the contact 214 serving as a cathode. In some embodiments, as shown in FIG. 1, when the finFET unit 300a is forward-biased, the voltage is connected to the finFET unit 300a by applying the positive side to the doped region 206 (anode) and the negative side to the doped regions 208 (cathode). Therefore, a current 410 may flow from the anode to the cathode of the finFET unit 300a along a longer current path (i.e. the trace of the current 410 as shown in FIG. 3) than the conventional finFET gated diode due to the dummy contact (the contact 216) insertion. Therefore, the semiconductor device 500a may use an electrostatic discharge (ESD) protection device in the finFET technology to bypass the ESD stress. Also, the enlarged anode-to-cathode space may improve the anode-to-cathode parasitic capacitance, the contact-to metal layer parasitic capacitance and the self-heating problems of the high-density finFET devices.

In the semiconductor device 600a as shown in FIG. 1, the substrate 200 is an n-type substrate 200, the well doped region 202 is a p-well doped region. Also, the doped region 206 is an n+ doped region and the doped region 208 is a p+ doped region. Accordingly, the finFET unit 300a of the semiconductor device 600a may serve as a finFET gated diode with the contact 214 serving as an anode and the contact 212 serving as a cathode.

Figure 2:
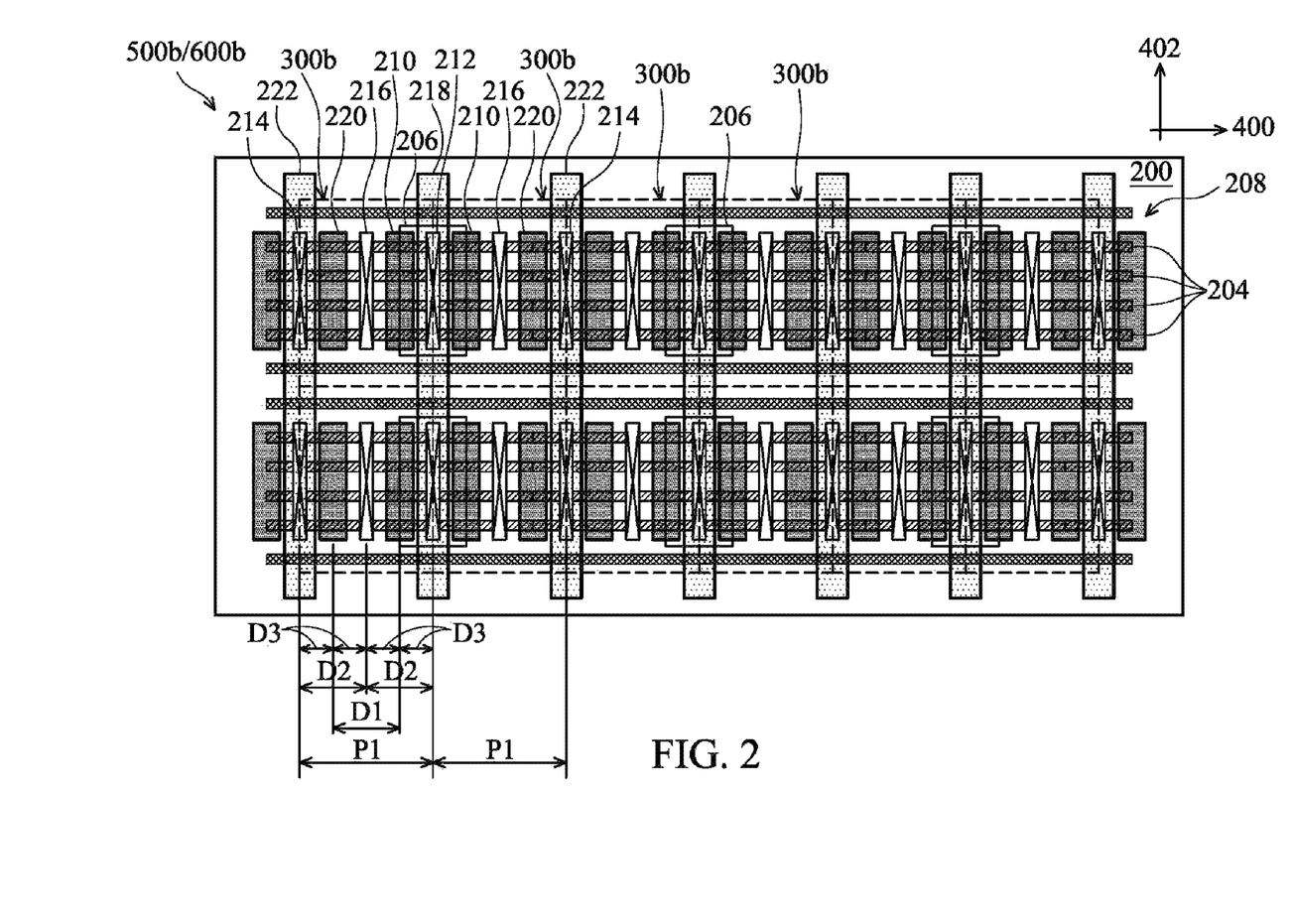
FIG. 2 is a top view of a semiconductor device in accordance with some embodiments of the disclosure.

FIG. 2 is a top view of a semiconductor device 500b/600b in accordance with some embodiments of the disclosure. Elements of the embodiments hereinafter that are the same or similar as those previously described with reference to FIGS. 1 and 3 are not repeated for brevity. In some embodiments, when the first conduction type is p-type and the second conduction type is n-type, the semiconductor device as shown in FIG. 2 serves as the semiconductor device 500b. Alternatively, when the first conduction type is n-type and the second conduction type is p-type, the semiconductor device as shown in FIG. 2 serves as the semiconductor device 600b. One of the differences between the semiconductor devices 500a/600a and 500b/600b is that the semiconductor device 500b/600b is formed without a well doped region surrounding finFET units 300b of a finFET array.

Figure 4:
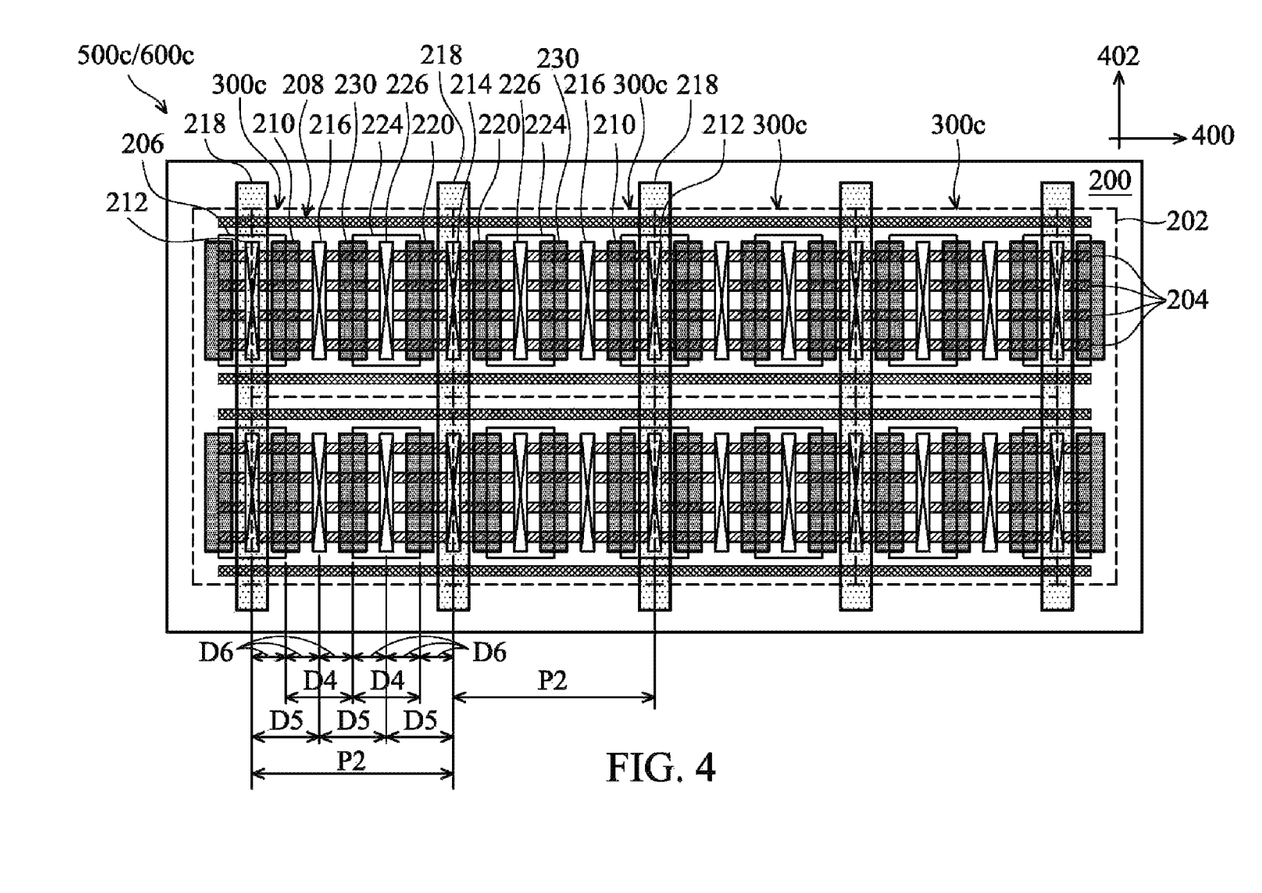
FIG. 4 is a top view of a semiconductor device in accordance with some embodiments of the disclosure.
Figure 6:
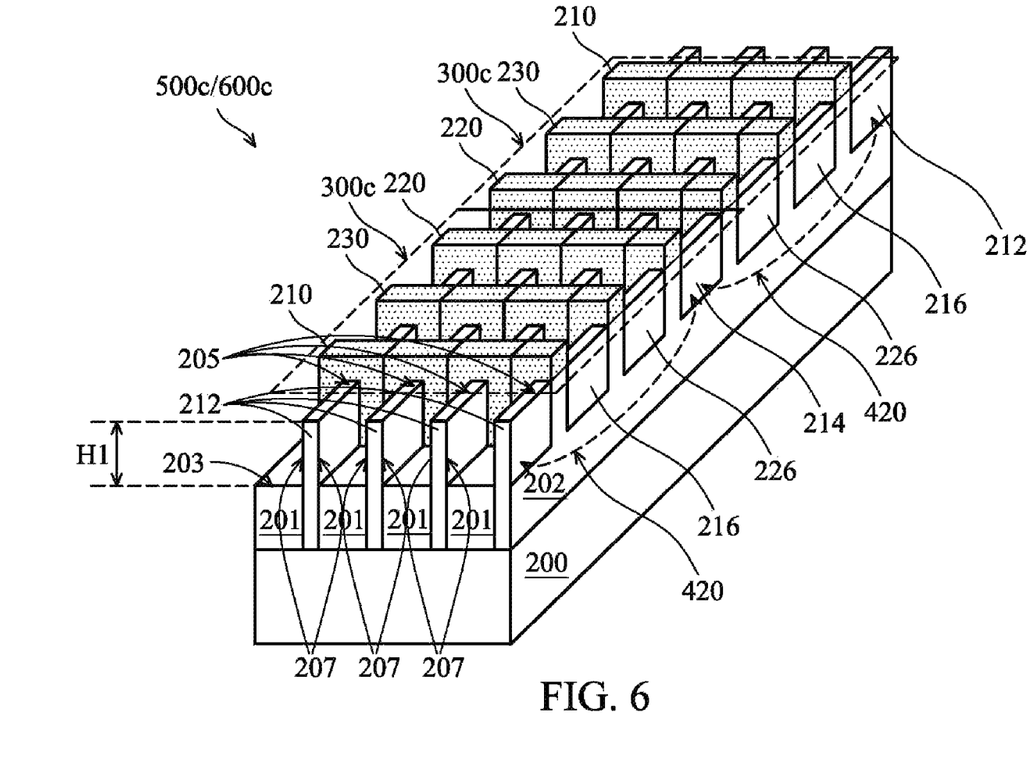
FIG. 6 is a perspective view of a portion of FIG. 4 showing a fin field effect transistor (finFET) array composed of finFET unit cells in accordance with some embodiments of the disclosure.

FIG. 4—is a top view of a semiconductor device 500c/600c in accordance with some embodiments of the disclosure. FIG. 6 is a perspective view of a portion of FIG. 4 showing a finFET array composed of finFET unit cells 300c in accordance with some embodiments of the disclosure. Elements of the embodiments hereinafter that are the same or similar as those previously described with reference to FIGS. 1-3 are not repeated for brevity. In some embodiments, when the first conduction type is p-type and the second conduction type is n-type, the semiconductor device as shown in FIG. 4 serves as the semiconductor device 500c. Alternatively, when the first conduction type is n-type and the second conduction type is p-type, the semiconductor device as shown in FIG. 4 serves as the semiconductor device 600c. Please refer to FIGS. 1, 3, 4 and 6: one of the differences between the semiconductor devices 500a/600a and 500c/600c is that the semiconductor device 500c/600c comprises another dummy contact inserted within the finFET unit cells 300c, another metal strip is accordingly inserted between the two dummy contacts to follow the finFET design rule.

In some embodiments as shown in FIG. 4 and FIG. 6, the finFET unit 300c of the semiconductor device 500c comprises at least three metal strip patterns 210, 220 and 230 formed on the fins 204. The metal strip patterns 210, 220 and 230 parallel to one another are formed extending along the direction 402. Also, the metal strip pattern 230 is conformally formed on opposite sidewalls 207 and the top surfaces 205 of the fins 204. In some embodiments, the metal strip pattern 230 is electrically floating or coupled to a circuit (not shown). As shown in FIG. 4, the metal strip patterns 210, 220 and 230 are arranged in an array along the direction 400 to follow. In some embodiments, a pitch D4 of the metal strip patterns 210, 220 and 230 can be equal to one-third of the pitch P2 of the finFET units 300c (i.e. D4=⅓P2, wherein P2 is a pitch of the finFET units 300c). It should be noted that the relationship between the distance D4 and the pitch P2 of the finFET units 300c is merely an embodiment. The distance D4 can be designed to be greater than a specific value and not limited to the disclosed embodiment.

In some embodiments as shown in FIG. 4 and FIG. 6, the finFET unit 300c of the semiconductor device 500c further comprises a doped region 224 formed in the substrate 200 and within the well region 202 by an implantation process. The conduction type of the doped region 224 is the same as that of the doped regions 206. Also, the doped region 224 is heavily doped region, is the same as the doped region 206. The doped region 224 is formed in a third portion of the fin 204. The doped region 224 is adjacent to the doped region 208 but separated from the doped region 206. It should be noted that the third portion of the fin 204 is a region overlapping the doped region 224. In this embodiment, the doped region 208 is formed in the remaining portion excepting the first and third portions of the fin 204. For example, the doped region 208 is formed between the doped regions 206 and 224 along the direction 400.

In some embodiments as shown in FIG. 4, the metal strip pattern 210 overlaps both the doped regions 206 and 208. The metal strip patterns 220 and 230 overlap both the doped regions 208 and 224, respectively.

In some embodiments as shown in FIG. 4 and FIG. 6, the finFET unit 300c of the semiconductor device 500c further comprises another contact 226 formed on the fin 204. The contact 226 is formed between the metal strip patterns 220 and 230, and the contact 216 is between the metal strip patterns 210 and 220. Similar to the contact 216, the contact 226 is electrically floating. Therefore, the contact 226 may serve as a dummy contact of the finFET unit 300c. Also, the contact 226 is coupled to the doped region 224, and the contact 216 is coupled to the doped region 208 between the doped regions 206 and 224 along the direction 400. In this embodiment, the contacts 212, 216, 226 and 214 are arranged as an array along the direction 400. In some embodiments, a pitch D5 of the contacts 212, 216, 226 and 214 can be equal to one-third of the pitch P2 of the finFET units 300c (i.e. D5=⅓P2, wherein P2 is a pitch of the finFET units 300c). It should be noted that the relationship between the distance D5 and the pitch P2 of the finFET units 300c is merely an embodiment. The distance D5 can be designed to be greater than a specific value and not limited to the disclosed embodiment. In this embodiment, the metal strip pattern 210 may be separated from the contacts 212 and 216 by a distance D6, respectively. The metal strip pattern 220 may be separated from the contacts 214 and 226 by the same distance D3, respectively. The metal strip pattern 220 may be respectively separated from the contacts 216 and 226 by the same distance D6 to follow the finFET design rule. Therefore, the distance D6 can be equal to one-sixth of the pitch P2 of the finFET units 300c (i.e. D6=⅙P2, wherein P2 is a pitch of the finFET units 300c). It should be noted that the relationship between the distance D6 and the pitch P2 of the finFET units 300c is merely an embodiment. The distance D6 can be designed to be greater than a specific value and not limited to the disclosed embodiment.

In the semiconductor device 500c as shown in FIG. 4, the substrate 200 is a p-type substrate 200, the well doped region 202 is an n-well doped region. Also, the doped region 206 is a p$^+$ doped region and the doped region 208 is an n$^+$ doped region. Accordingly, the finFET unit 300c of the semiconductor device 500c may serve as a finFET gated diode with the contact 212 serving as an anode and the contact 214 serving as a cathode. In some embodiments as shown in FIG. 4, when the finFET unit 300c is forward-biased, the voltage connected to the finFET unit 300c by applying the positive side to the doped region 206 (anode) and negative side to the doped regions 208 (cathode). Therefore, a current 420 may flow from the anode to the cathode of the finFET unit 300c along a longer current path (i.e. the trace of the current 420 as shown in FIG. 6) than the conventional finFET gated diode due to the dummy contact (the contacts 216 and 226) insertion. Therefore, the semiconductor device 500c may be used as an electrostatic discharge (ESD) protection device in the finFET technology to bypass the ESD stress. Also, the enlarged anode-to-cathode space may improve the anode-to-cathode parasitic capacitance, the contact-to metal layer parasitic capacitance and self-heating problems in the high-density finFET devices.

Figure 5:
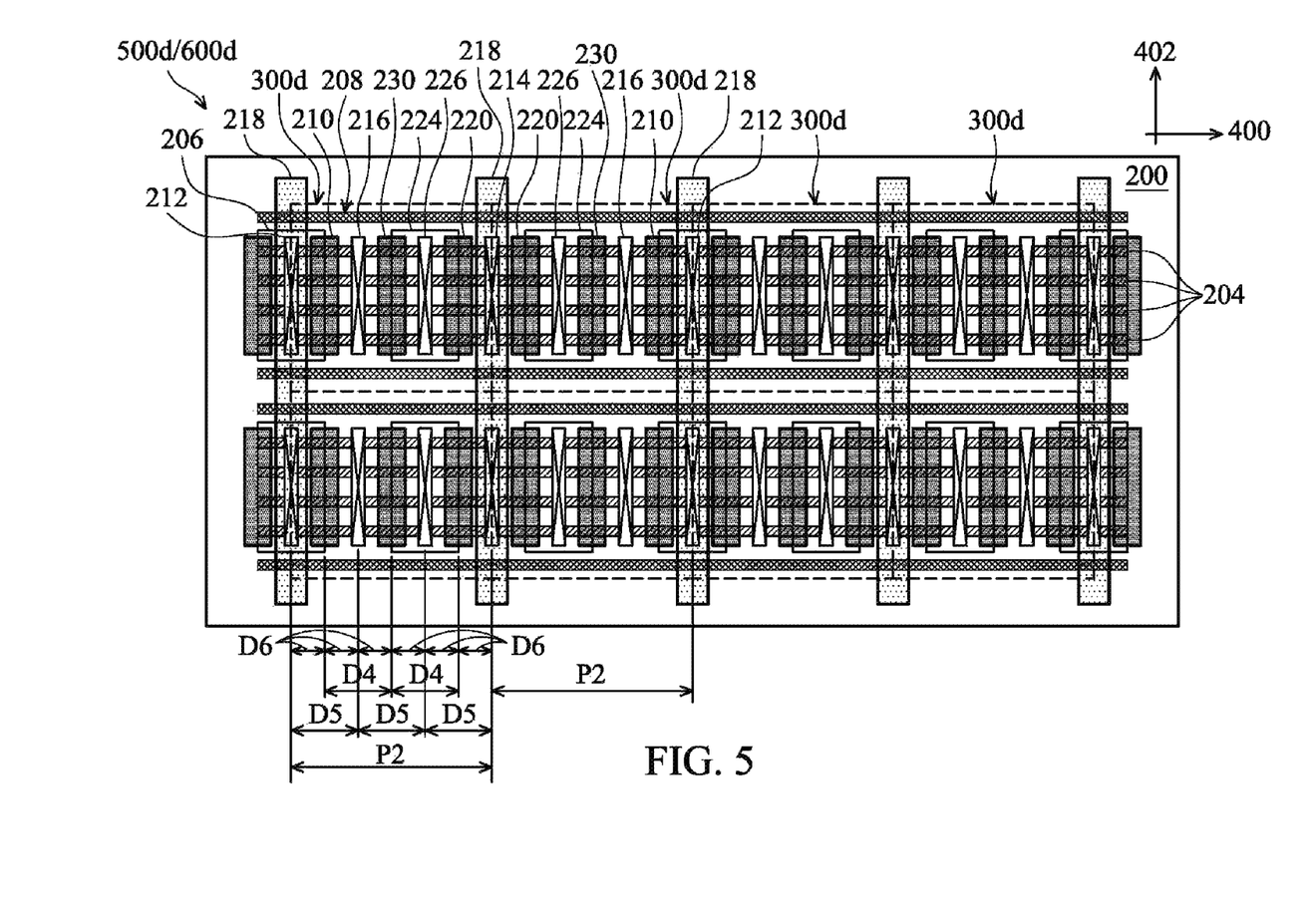
FIG. 5 is a top view of a semiconductor device in accordance with some embodiments of the disclosure.

FIG. 5 is a top view of a semiconductor device 500d/600d in accordance with some embodiments of the disclosure. Elements of the embodiments hereinafter that are the same or similar as those previously described with reference to FIGS. 4 and 6 are not repeated for brevity. In some embodiments, when the first conduction type is p-type and the second conduction type is n-type, the semiconductor device as shown in FIG. 5 serves as the semiconductor device 500d. Alternatively, when the first conduction type is n-type and the second conduction type is p-type, the semiconductor device as shown in FIG. 5 serves as the semiconductor device 600d. One of the differences between the semiconductor devices 500c/600c and 500d/600d is that the semiconductor device 500d/600d is formed without a well doped region surrounding finFET units 300d of a finFET array.

Figure 7:
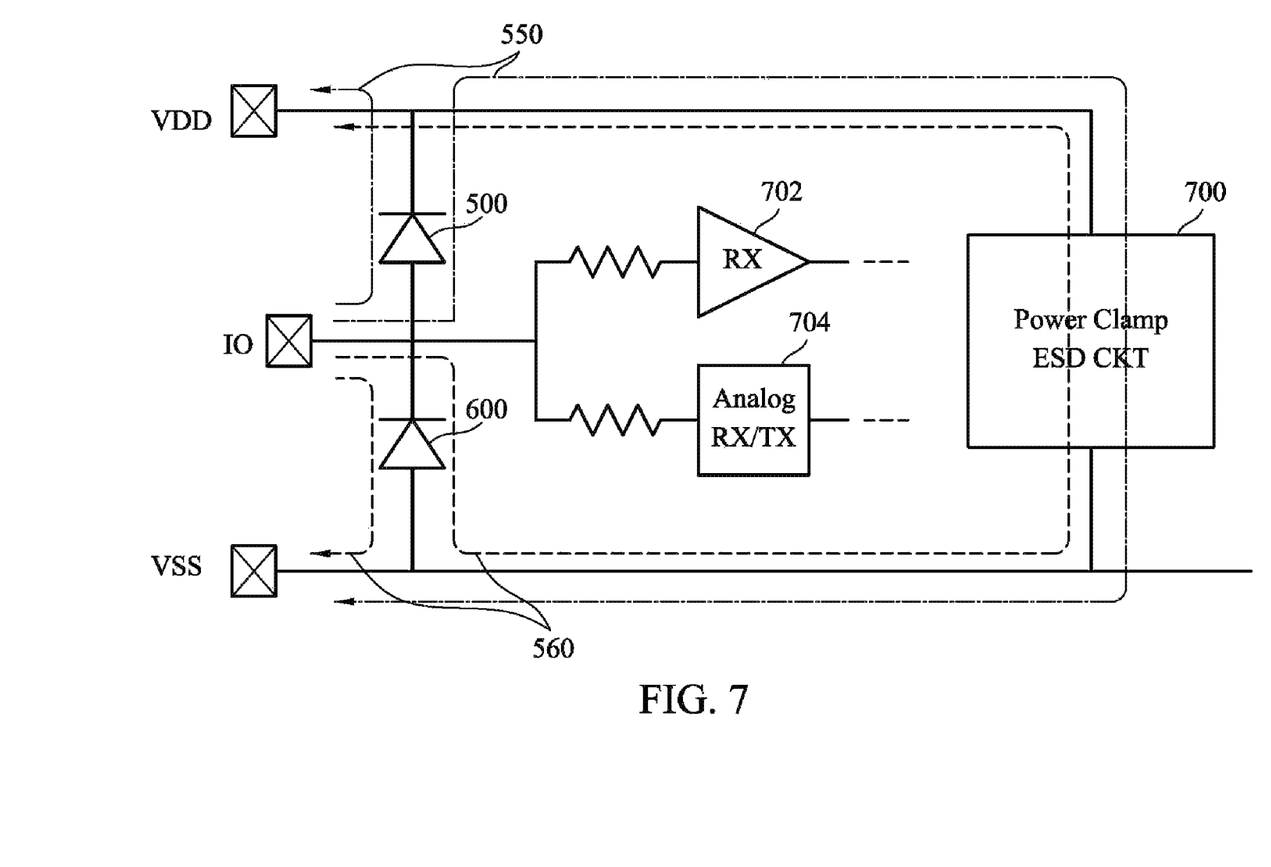
FIG. 7 is an equivalent circuit diagram showing an analog input/output (I/O) circuit with a semiconductor device in accordance with some embodiments.

FIG. 7 is an equivalent circuit diagram showing an analog input/output (I/O) circuit with semiconductor devices 500 and 600 in accordance with some embodiments. In some embodiments, the semiconductor device 500 operated as a finFET gated diode may include semiconductor devices 500a-500d, and the semiconductor device 600 operated as a finFET gated diode may include semiconductor devices 600a-600d as shown in FIGS. 1-6. In the analog I/O circuit as shown in FIG. 7, sensitive analog devices 702 and 704 are coupled to an input/output (I/O) node IO. The semiconductor devices 500 and 600 may be applied as an ESD protection device and coupled between the I/O node IO and a power-supply node VDD to bypass the ESD stress and protect the sensitive analog devices 702 and 704. More specifically, the anode and the cathode of the semiconductor device 500 are coupled to the power-supply node VDD and the I/O node IO. The anode and the cathode of the semiconductor device 600 are coupled to the I/O node IO and a power-ground node VSS. Also, a power clamp ESD circuit 700 is coupled between the power-supply node VDD and the power-ground node VSS of the analog I/O circuit to bypass the ESD stress.

As shown in FIG. 7, when a positive ESD stress occurs at the I/O node IO, the semiconductor device 500 is forward-biased, and then the ESD current is discharged from the I/O node IO to the power-supply node VDD or through the power clamp ESD circuit 700 to the power-ground node VSS along a path 550. Alternatively, when a negative occurs at the I/O node IO, the semiconductor device 600 is forward-biased, and then the ESD current is discharged from the I/O node IO to the power-ground node VSS or through the power clamp ESD circuit 700 to the power-supply node VDD along a path 560.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. A semiconductor device, comprising:
   a fin field effect transistor (finFET) array comprising finFET unit cells, wherein each of the finFET unit cells comprises:
   a substrate having a fin along a first direction;
   a first metal strip pattern and a second metal strip pattern on the fin, extending along a second direction that is different from the first direction, wherein the first and second metal strip patterns are conformally formed on opposite sidewalls and a top surface of the fin, respectively;
   a first contact and a second contact on the fin, wherein the first and second metal strip patterns are disposed between the first and second contacts; and
   a first dummy contact on the fin, sandwiched between the first and second metal strip patterns.

2. The semiconductor device as claimed in claim 1, wherein the substrate is a first conduction type, further comprising:
   a first doped region of the first conduction type formed in a first portion of the fin, wherein the first contact is coupled to the first doped region; and
   a second doped region formed in a second portion of the fin, wherein the second doped region is a second conduction type that is opposite to the first conduction type, wherein the second contact is coupled to the second doped region.

3. The semiconductor device as claimed in claim 2, wherein the first dummy contact is coupled to the second doped region.

4. The semiconductor device as claimed in claim 2, further comprising a well doped region of the second conduction type formed in the substrate, wherein the finFET unit cells are disposed within the well doped region.

5. The semiconductor device as claimed in claim 1, wherein the fin has a region overlapped with any of the first and second metal strip patterns and between the first and second contacts.

6. The semiconductor device as claimed in claim 1, wherein the first dummy contact is electrically floating.

7. The semiconductor device as claimed in claim 1, wherein each of the finFET unit cells is a gated diode, and the first and second contacts are an anode and a cathode of the gated diode, respectively.

8. The semiconductor device as claimed in claim 1, further comprising:
a third metal strip pattern that is substantially parallel to the first and second metal strip patterns, wherein the third metal strip pattern is between the first and second metal strip patterns; and
a second dummy contact on the fin, between the second and third metal strip patterns, wherein the first dummy contact is between the first and third metal strip patterns.

9. The semiconductor device as claimed in claim 8, further comprising:
a third doped region of the first conduction type formed in a third portion of the fin and adjacent to the second doped region, wherein the second dummy contact is coupled to the third doped region, and
wherein the second doped region of the second conduction type formed in a fourth portion of the fin and between the first and third doped regions, wherein the first dummy contact is coupled to the second doped region.

10. A semiconductor device, comprising:
a fin field effect transistor (finFET) array comprising finFET unit cells, wherein each of the finFET unit cells comprises:
a substrate having a fin along a first direction;
a first contact on the fin, coupled to a first doped region of the first conduction type formed in a first portion of the fin;
a second contact on the fin, coupled to a second doped region formed in a second portion of the fin, wherein the second doped region has a second conduction type that is opposite to the first conduction type; and
a first gate strip and a second gate strip on the fin, between the first and second contacts and separated from each other by a third contact, wherein the third contact is electrically floating.

11. The semiconductor device as claimed in claim 10, further comprising a well doped region of the second conduction type formed in the substrate, wherein the finFET unit cells are disposed within the well doped region.

12. The semiconductor device as claimed in claim 10, wherein the third contact is disposed on the fin and is coupled to the second doped region.

13. The semiconductor device as claimed in claim 10, wherein the first gate strip overlaps both the first and second doped regions, and the second gate strip overlaps the second doped region only.

14. The semiconductor device as claimed in claim 10, further comprising:
a third gate strip pattern that is substantially parallel to the first and second gate strip, wherein the third gate strip is between the first and second metal gate strips; and
a fourth contact on the fin, between the second and third gate strips, wherein the first contact is between the first and third gate strips, wherein the fourth contact is electrically floating.

15. The semiconductor device as claimed in claim 14, further comprising:
a third doped region of the first conduction type formed in a third portion of the fin and adjacent to the second doped region, wherein the second dummy contact is coupled to the third doped region; and
wherein the second doped region of the second conduction type formed in a fourth portion of the fin and between the first and third doped regions, wherein the first dummy contact is coupled to the second doped region.

16. The semiconductor device as claimed in claim 15, wherein the first gate strip overlaps both the first and second doped regions, the second gate strip overlaps both the second and third doped regions, and the third gate strip overlaps both the third and second doped regions.

17. A fin-like electronic device, comprising:
an device array composed of field effect transistor (finFET) unit cells with a pitch, wherein each of the finFET unit cells comprises:
a substrate having a fin along a first direction;
a first contact on the fin, coupled to a first doped region of the first conduction type formed in a first portion of the fin;
a second contact on the fin, coupled to a second doped region formed in a second portion of the fin, wherein the second doped region has a second conduction type that is opposite to the first conduction type; and
a first gate strip and a second gate strip on the fin, between the first and second contacts and separated from each other by a first dummy contact, wherein the first dummy contact is separated from the first gate strip and the second gate strip by a first distance.

18. The fin-like electronic device as claimed in claim 17, wherein the first dummy contact is electrically floating.

19. The fin-like electronic device as claimed in claim 17, further comprising a well doped region of the second conduction type formed in the substrate, wherein the finFET unit cells are disposed within the well doped region.

20. The fin-like electronic device as claimed in claim 18, further comprising:
a third gate strip pattern that is substantially parallel to the first and second gate strip, wherein the third gate strip is between the first and second metal gate strips; and
a second dummy contact on the fin, between the second and third gate strips, wherein the first contact is between the first and third gate strips, wherein the first dummy contact and the second dummy contact are electrically floating.

* * * * *